(12) United States Patent
Chen et al.

(10) Patent No.: US 6,649,532 B1
(45) Date of Patent: Nov. 18, 2003

(54) METHODS FOR ETCHING AN ORGANIC ANTI-REFLECTIVE COATING

(75) Inventors: Hui Chen, Burlingame, CA (US);
Xikun Wang, Sunnyvale, CA (US);
Hong Shih, Walnut Creek, CA (US);
Chun Yan, San Jose, CA (US);
Wai-Fan Yau, Los Altos, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/143,489

(22) Filed: May 9, 2002

(51) Int. Cl.[7] .............................................. H01L 21/302
(52) U.S. Cl. ...................... 438/714; 438/725; 438/717; 438/736; 438/715; 430/5
(58) Field of Search ................. 438/725, 717, 438/714, 736, 715; 430/5

(56) References Cited

U.S. PATENT DOCUMENTS 6,039,888 A  *  3/2000  Ha et al. ...................... 216/13
6,080,678 A  *  6/2000  Yim ............................. 438/725
6,187,688 B1 *  2/2001  Ohkuni et al. ............... 438/725
6,296,780 B1    10/2001  Yan et al. ...................... 216/67
2002/0182881 A1 * 12/2002  Ni et al. ...................... 438/725

FOREIGN PATENT DOCUMENTS

JP      10-242127      *  9/1998
WO      200 22 9879    *  4/2002

* cited by examiner

*Primary Examiner*—George Goudreau
(74) *Attorney, Agent, or Firm*—Michael B. Einschlag; Joseph Bach

(57) ABSTRACT

One embodiment of the present invention is a process for etching an organic anti-reflective coating on a base of a substrate, the process including steps of: (a) placing the substrate into a processing chamber; (b) introducing into the processing chamber a processing gas including one or more of carbon monoxide (CO), carbon dioxide ($CO_2$), and sulfur oxide ($SO_2$); and (c) forming a plasma from the processing gas to etch the organic anti-reflective coating layer.

14 Claims, 2 Drawing Sheets

METHODS FOR ETCHING AN ORGANIC ANTI-REFLECTIVE COATING

TECHNICAL FIELD OF THE INVENTION

One or more embodiments of the present invention pertain to methods for use in fabricating integrated circuit device structures on a substrate, and, in particular, to methods for etching an organic anti-reflective coating.

BACKGROUND OF THE INVENTION

Critical dimensions and geometries of semiconductor devices have decreased steadily in size since they were first introduced. Although, currently, most semiconductor devices are fabricated with feature sizes of about 0.18 $\mu$m–0.25 $\mu$m, it is desirable to produce semiconductor devices, for example, semiconductor integrated circuit chips, with smaller feature sizes, such as 0.13 $\mu$m microns and lower. Fabricating such semiconductor devices includes forming a patterned thin film or layer on a base substrate of the device by chemical reaction of gases. When patterning thin films, it is desirable that fluctuations in line width and other critical dimensions be minimized. Errors in these critical dimensions can result in variations in device characteristics or open-/short-circuited devices, thereby adversely affecting device yield. Some manufacturers now require that variations in dimensional accuracy of patterning operations be held to within 5% of dimensions specified by a designer.

A typical fabrication process utilizes photolithographic techniques to pattern films or layers. These techniques typically entail fabricating a pattern in a photoresist layer deposited on a substrate. With the photoresist pattern acting as a mask, underlying layer(s) are further processed. For example, the underlying layer(s) may be doped or etched, or other processing may be performed.

As is known, some photolithographic techniques entail the use of monochromatic radiation to produce the patterns. However, as a substrate is processed, a topology of the substrate's upper surface becomes progressively uneven. This can cause reflection and refraction of the monochromatic radiation, resulting in exposure of some of the photoresist layer beneath portions of the mask. As a result, the uneven surface can alter the pattern transferred to the photoresist layer, thereby altering desired dimensions of structures fabricated subsequently.

As is also known, when a photoresist layer is deposited on a reflective underlying layer, and is exposed to monochromatic radiation, standing waves may be produced within the photoresist layer. The existence of standing waves in the photoresist layer during exposure can cause roughness in vertical walls formed when sections of the photoresist layer are removed during patterning. This can translate into variations in line widths, spacing, and other critical dimensions.

The use of an anti-reflective coating ("ARC") is one technique currently used to help reduce and/or eliminate the standing waves. An ARC's optical characteristics are such that reflections occurring at inter-layer interfaces are minimized. One type of ARC is a titanium nitride anti-reflective coating ("TiN ARC"). A TiN ARC is typically used with substrates that have conductive features (for example, conductive features that include an aluminum alloy) used to electrically connect devices formed on the substrates. The conductive features are typically formed over a barrier-adhesion layer, and under a TiN ARC.

It has been determined that (for certain applications) a TiN ARC (by itself) does not satisfy processing requirements, and as a result, another anti-reflective layer, such as an organic anti-reflective coating ("OARC"), is typically spun on top of the TiN ARC. The substrate with the OARC is then processed using an etch process to selectively etch portions of the substrate. The etch process entails introducing a selected process gas into a processing chamber, and producing a plasma of the process gas. The plasma selectively etches the substrate, and creates volatile etch by-products that are exhausted from the processing chamber. In accordance with an etch process used for device dimensions of 0.25 $\mu$m and smaller, a process gas used to etch the OARC ("OARC-open" etch) is a mixture of gases such as, for example, $Cl_2/(CHF_3$ or $CF_4)$, and a process gas used to etch an aluminum alloy layer ("Al main etch") is a mixture of gases such as, for example, $Cl_2/BCl_3/CHF_3$. The above-described OARC-open etch and Al main etch create a problem because of the following. During the Al main etch, $AlCl_3$ containing etch by-products are deposited in the processing chamber (for example, on a dome of a Decoupled Plasma Source ("DPS") Metal Etch chamber available from Applied Materials, Inc. of Santa Clara, Calif.). Further, the OARC-open etch creates a "fluorine-rich" environment in the processing chamber. The problem arises because the fluorine reacts with the $AlCl_3$ containing etch by-products to form $AlF_3$, containing by-products, and $AlF_3$ containing by-products are difficult to remove from the processing chamber (for example, by use of in-situ chamber cleaning processes available with the DPS Metal Etch chamber). As a result, the $AlF_3$ containing by-products are a potential particle source, and thus the mean wafer between clean (MWBC) is reduced.

An additional problem with the use of the above-described OARC-open etch process and Al main etch process is that: (a) during the OARC-open etch, $CHF_3$ interacts with the photoresist mask and substrate material to form polymers which are deposited, for example, on the photoresist; and (b) during the Al main etch process, $CHF_3$ interacts with Al and forms $AlF_3$ that coats the polymers and the aluminum features. Later, when the substrate undergoes processing to strip the photoresist mask, $AlF_3$ coated polymers may remain as an unwanted structure that is sometimes referred to as "rabbit ears." Thus, the strippability is affected.

Although $O_2$ might appear to be useful in solving the above-described problems its use creates new problems. Namely, $O_2$ reacts with $BCl_3$ that is utilized in the Al main etch. This creates a problem because this reaction may clog up gas lines or a gas manifold used to dispense processing gases into the processing chamber.

SUMMARY OF THE INVENTION

One or more embodiments of the present invention advantageously solve one or more of the above-identified problems. In particular, one embodiment of the present invention is a process for etching an organic anti-reflective coating on a base of a substrate, the process comprising steps of: (a) placing the substrate into a processing chamber; (b) introducing into the processing chamber a processing gas comprising one or more of carbon monoxide (CO), carbon dioxide ($CO_2$), and sulfur oxide ($SO_2$); and (c) forming a plasma from the processing gas to etch the organic antireflective coating layer.

DETAILED DESCRIPTION

Figure 1:
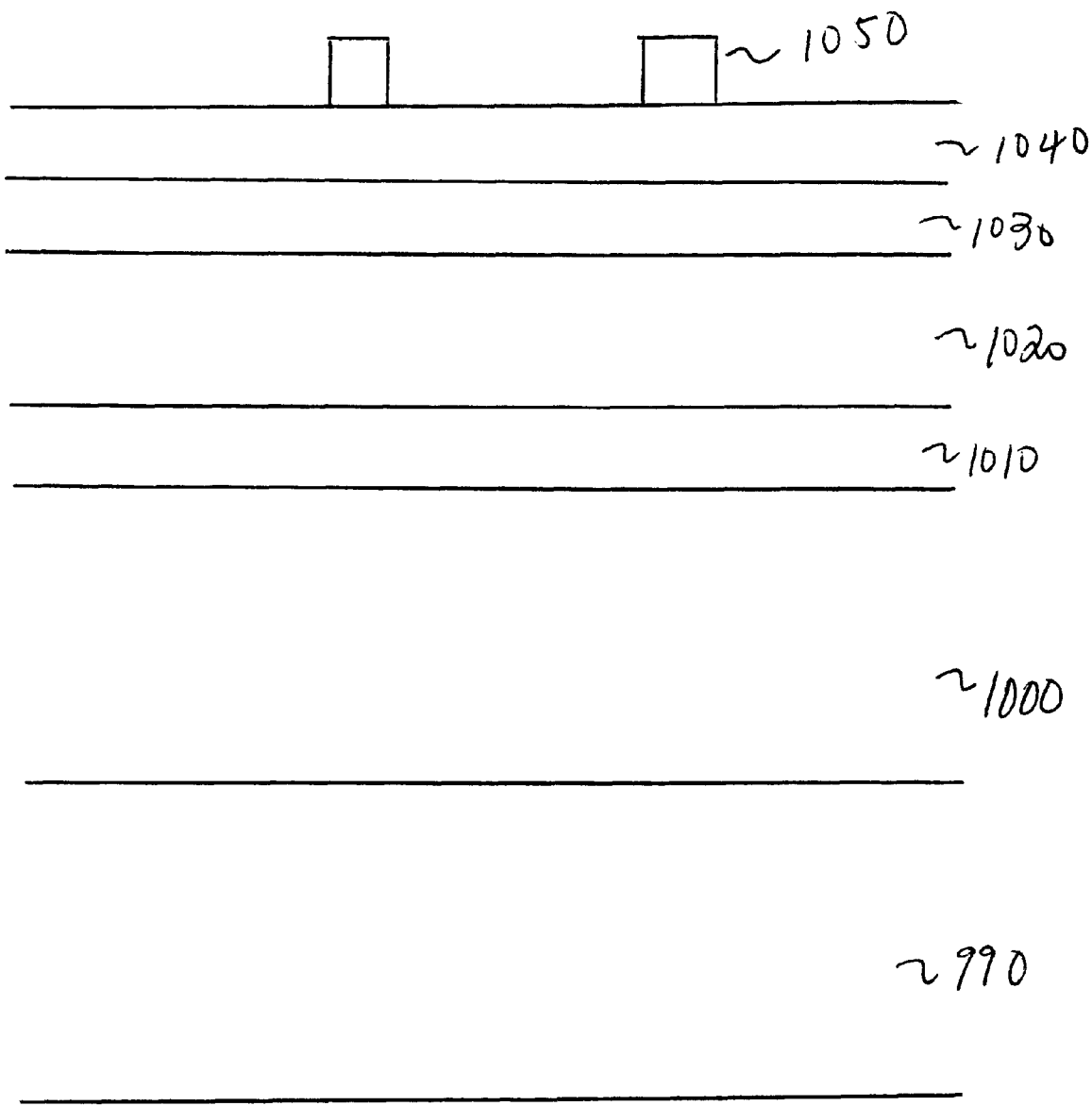
FIG. 1 shows a block diagram of a film structure used to fabricate integrated circuits.

FIG. 1 shows a block diagram of a cross section of an example of a film stack structure used to fabricate integrated circuits. As shown in FIG. 1, the film stack structure comprises insulative layer 1000 (for example, and without limitation, insulative layer 1000 is a silicon oxide layer) that is formed over base structure 990. Base structure 990 can be made of any material, such as semiconductor, glass, ceramic, metal, or polymer, and may be a semiconductor wafer. Barrier-adhesion layer 1010 is formed on insulative layer 1000 (for example, and without limitation, barrier-adhesion layer 1010 includes a Ti, Ta, or W adhesion layer, and a TiN, TaN, or WN barrier layer), and barrier-adhesion layer 1010 might have a total thickness in a range from about 250 Å to about 500 Å. Aluminum layer 1020 ("Al layer 1020") is formed on barrier-adhesion layer 1010 (for example, and without limitation, Al layer 1020 typically comprises an alloy of aluminum such an alloy of aluminum and copper, or an alloy of aluminum, silicon, and copper), and might have a thickness in a range from about 2500 Å to about 5000 Å. TiN anti-reflective coating layer 1030 ("TiN ARC layer 1030") is formed over Al layer 1020, and might have a thickness in a range from about 250 Å to about 400 Å. Organic anti-reflective coating layer 1040 ("OARC layer 1040") is formed (for example, by a spin-on process) on TiN ARC 1030, and typically might have a thickness in a range from about 250 Å to about 600 Å. Lastly, patterned photoresist layer 1050 ("PR layer 1050") is formed on OARC 1040, and might have a thickness in a range from about 4000 Å to about 6000 Å.

As is well known, OARC 1040 and TiN ARC 1030 are utilized to enable photolithographic processes that pattern PR layer 1050, which PR layer 1050 enables etching of Al layer 1020. In various embodiments, OARC layer 1040 may be a carbon containing material that is formed, for example, and without limitation, by a spin-on process on top of TiN ARC layer 1030 (the carbon containing material can be a polymeric material). After the film stack shown in FIG. 1 is formed, one proceeds to etch OARC layer 1040 in accordance with one or more embodiments of the present invention.

One or more embodiments of the present invention are fluorine-free, organic anti-reflective coating ("ORAC") layer etch processes ("OARC-open" etch processes). In accordance with one embodiment of the present invention, a processing gas that includes carbon monoxide (CO) is utilized in a plasma chamber (for example, and without limitation, a high density plasma chamber) to perform an OARC-open etch process. Further, in accordance with one or more embodiments of the present invention, a processing gas that includes CO and/or carbon dioxide ($CO_2$) and/or sulfur oxide ($SO_2$) is utilized in a plasma chamber (for example, and without limitation, a high density plasma chamber) to perform the OARC-open etch process. Still further, in accordance with one or more embodiments of the present invention, the processing gas of one or more of the above-described embodiments further includes a chlorine-based gas such as, for example, and without limitation, $Cl_2$. Yet still further, in accordance with one or more of embodiments of the present invention, the processing gas of one or more of the above-described embodiments further includes $BCl_3$ and/or a diluent such as, for example, and without limitation, Ar or He.

Figure 2:
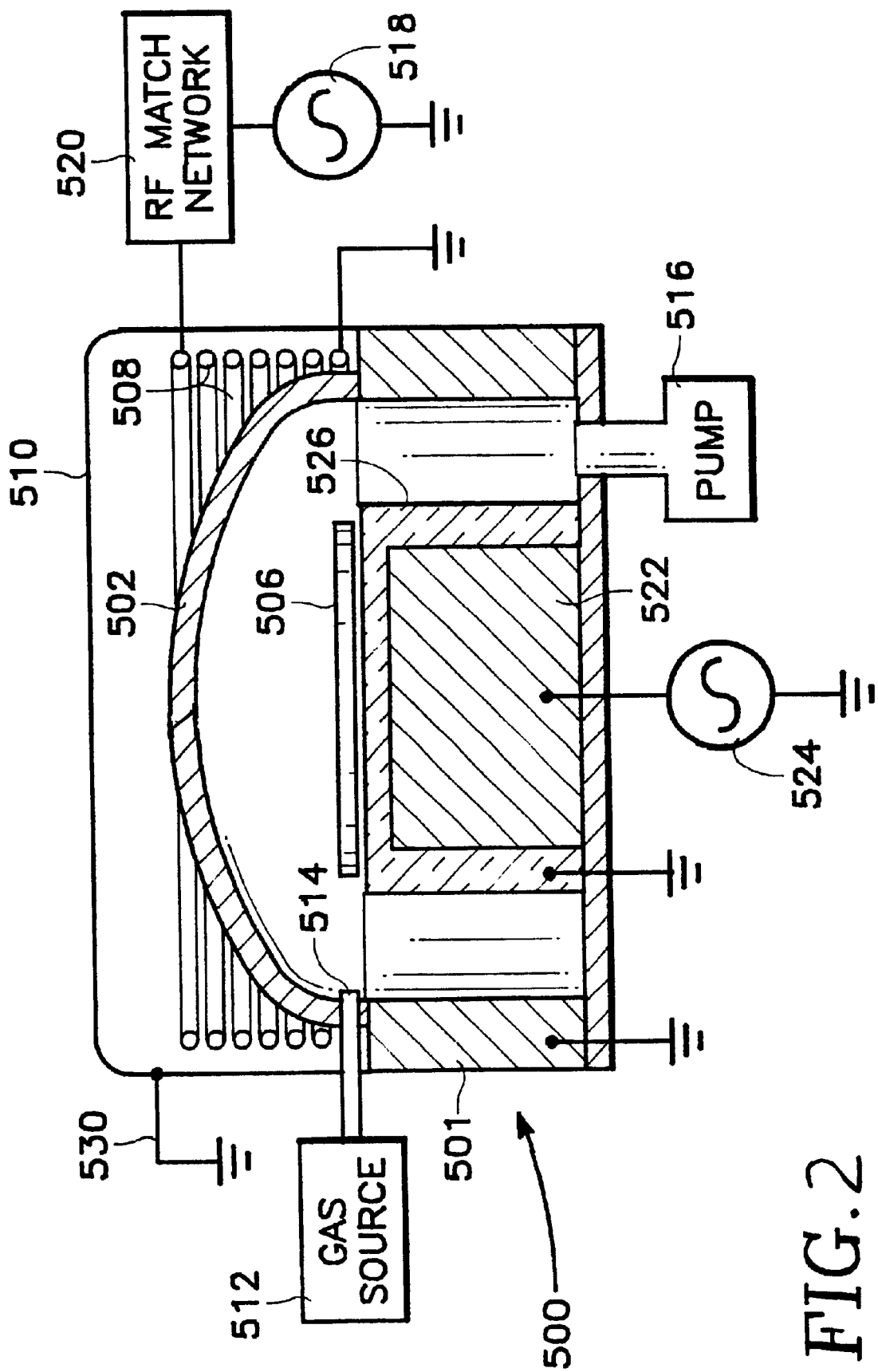
FIG. 2 is a cross-section of an apparatus suitable for practicing one or more embodiments of the present invention.

Any one of a number of processing apparatus can be used to practice one or more embodiments of the present invention. For example, a Decoupled Plasma Source ("DPS") Metal Etch Chamber apparatus available from Applied Materials, Inc. of Santa Clara, Calif. may be used to practice one or more embodiments of the present invention. FIG. 2 is a cross-section of an apparatus suitable for use in practicing one or more embodiments of the present invention. As shown in FIG. 2, an inductively-coupled, RF plasma etching apparatus includes processing chamber 500 that includes grounded, conductive, cylindrical sidewall 501, and dielectric ceiling 502. As further shown in FIG. 2, the etching apparatus includes wafer pedestal (or cathode) 526 that supports semiconductor wafer or substrate 506 substantially in the center of processing chamber 500. In accordance with one or more embodiments of the present invention, wafer pedestal 526 actively holds the substrate in place, for example, and without limitation, by including an electrostatic chuck mechanism that is well known to those of ordinary skill in the art. Processing chamber 500 further includes: (a) cylindrical inductor coil 508 that surrounds an upper portion of processing chamber 500 (beginning near a plane at the top of wafer pedestal 526 and extending upwardly therefrom toward top 510 of processing chamber 500); (b) processing gas source 512; (c) gas inlet 514 that furnishes a processing gas into the interior of processing chamber 500; and (d) pump 516 that controls the pressure in processing chamber 500.

Inductor coil 508 is energized by plasma source power supply (or RF generator) 518 through RF match network 520, the top winding of inductor coil 508 being "hot" and the bottom winding being grounded. Wafer pedestal 526 includes an interior conductive portion 522 that is connected to RF bias power supply (or generator) 524 and an exterior grounded conductor (insulated from interior conductive portion 522). Conductive, grounded, RF shield 530 surrounds inductor coil 508.

To effect an OARC-open etch, substrate 506 is transferred into processing chamber 500, and placed on wafer pedestal 526. A process gas output from processing gas source 512 is introduced into processing chamber 500 through gas inlet 514 (in alternative embodiments, the processing gas may be input through a showerhead apparatus that is well known to those of ordinary skill in the art). A plasma is generated and maintained by applying power to inductor coil 508 from RF generator 518 through RF match network 520, and by applying power to interior conductive portion 522 of wafer pedestal 504 from RF bias power supply 524. Processing chamber 500 is maintained at a process pressure that is determined by the flow of the process gas into processing chamber 500, and the pumping rate of pump 516.

In accordance with one or more embodiments of the present invention, anodized aluminum sidewall 501 is heated to a temperature of about 80° C. to prevent deposition of condensable etchant by-product species on sidewall 501 in accordance with any one of a number of methods that are well known to those of ordinary skill in the art. Appropriate ranges of values of sidewall temperature may be determined routinely by one of ordinary skill in the art without undue experimentation. In addition, in accordance with one or more embodiments of the present invention, dielectric ceiling 502 is maintained at a temperature of about 80° C. to prevent polymer deposition thereon to reduce particles in the process zone in accordance with any one of a number of methods that are well known to those of ordinary skill in the art. Appropriate ranges of values of dielectric ceiling temperature may be determined routinely by one of ordinary skill in the art without undue experimentation. In accordance with one or more embodiments of the present invention, wafer pedestal 526 is heated, for example, and without limitation, resistively, to a temperature in a range from about 30° C. to about 50° C. in accordance with any one of a number of methods that are well known to those of ordinary skill in the art. The plasma formed from the process gas may heat substrate 506 to a temperature in a range of about 60° C. to about 80° C. Further, in accordance with one or more embodiments of the present invention, the temperature of substrate 506 is maintained at a substantially constant level by passing a cooling gas (for example, and without limitation, helium) over a backside of substrate 506 in accordance with any one of a number of methods that are well known to those of ordinary skill in the art. Helium may flowed at pressure in a range from about 4 Torr to about 10 Torr. Appropriate ranges of values of backside cooling gas pressure may be determined routinely by one of ordinary skill in the art without undue experimentation.

In accordance with one embodiment of the present invention, process conditions for a 19.5 liter chamber (for example, a 200 mm DPS Metal Etch chamber) are: a flow rate for CO in a range from about 5 sccm to about 30 sccm; (optional) a flow rate for $Cl_2$ in a range from about 50 sccm to about 100 sccm; a chamber pressure in a range from about 2 mT to about 20 mT; an RF current applied to inductive coil 508 at a frequency (for example, and without limitation, a frequency of about 2 MHz) and at a power level (for example, and without limitation, a power level in a range from about 400 W to about 1000 W) sufficient to generate a plasma to etch the OARC layer; (optional) an RF bias current applied to wafer pedestal 526 at a frequency (for example, and without limitation, a frequency of about 13.56 MHz) and at power level (for example, and without limitation, a power level in a range from about 30 W to about 100 W) sufficient to cause the plasma generated by inductive coil 508 to impinge upon and etch the OARC layer; and a temperature of wafer pedestal 526 maintained in a range from about 30° C. to about 50° C. Further embodiments include substituting and/or adding one or more $SO_2$ and $CO_2$ to the process gas at flow rates for each in a range from about 5 sccm to about 30 sccm.

For a 300 mm chamber, for the above-described embodiments, the flow rates may be scaled to be a factor of about 2 larger than for the 200 mm chamber; the source power may be scaled to be about a factor of 1 larger than for the 200 mm chamber; and the bias power.may be scaled to be about a factor of about 1.5–2 larger than for the 200 mm chamber.

Referring to FIG. 1, the width of patterned photoresist layer 1050 at a location just above OARC layer 1040 is typically referred to as a pre-CD ("pre-etch critical dimension"). A corresponding width at about the bottom of Al layer 1020 after Al layer 1020 is etched (and, typically, after PR layer 1050 is stripped) is typically referred to as a post-CD ("post-etch critical dimension"). Finally, CD-bias= (post-CD-pre-CD). Advantageously, in accordance with one or more of such embodiments, the above-defined CD-bias can be controlled using one or embodiments of the present invention to produce CD-bias gain (i.e., CD-bias>0), CD-bias loss (i.e., CD-bias<0), or CD-bias=0 by varying one or more of the following process parameters: processing and diluent gas flow rate ratios; processing chamber pressure; temperature of a wafer pedestal heater and backside gas pressure to help define wafer temperature; power applied to a source of electromagnetic energy to generate a plasma; and power applied to a bias mechanism (if used). These process parameters may be varied within ranges of values that can be determined routinely by one of ordinary skill in the art without undue experimentation. In particular, in accordance with one embodiment of the present invention, a processing gas includes CO and/or $CO_2$ and/or $SO_2$. This processing gas is advantageous for an OARC-open etch because: (a) CO, $CO_2$, and $SO_2$ do not react with $BCl_3$ used to etch the aluminum layer; (b) they can etch organic material such as OARC isotropically; and (c) with the addition of $CO_2$ and/or $SO_2$ to CO, one can control CD-bias.

Those skilled in the art will recognize that the foregoing description has been presented for the sake o illustration and description only. As such, it is not intended to be exhaustive or to limit the invention to the precise form disclosed. For example, although certain dimensions were discussed above, they are merely illustrative since various designs may be fabricated using the embodiments described above, and the actual dimensions for such designs will be determined in accordance with circuit requirements.

What is claimed is:

1. A process for etching an organic anti-reflective coating on a base of a substrate, the process comprising steps of:

placing the substrate on a pedestal in a processing chamber;

introducing into the processing chamber an oxygen gas-free processing gas which includes an etchant precursor consisting of one of: (a) carbon monoxide, (b) carbon monoxide and carbon dioxide, (c) carbon monoxide, carbon dioxide, and sulfur oxide, (d) carbon monoxide and sulfur oxide, (e) carbon dioxide, and (f) carbon dioxide and sulfur oxide; and forming an oxygen gas-free plasma from the processing gas to etch the organic anti-reflective coating layer.

2. A process for etching an organic anti-reflective coating on a base of a substrate, the process comprising steps of:

placing the substrate on a pedestal in a processing chamber;

introducing into the processing chamber an oxygen gas-free processing gas comprising one or more of carbon monoxide, carbon dioxide, and sulfur oxide; and forming an oxygen gas-free plasma from the processing gas to etch the organic anti-reflective coating layer;

wherein the processing gas further comprises a chlorine-based gas.

3. The process of claim 2 wherein the chlorine-based gas includes chlorine.

4. The process of claim 1 wherein the processing gas further comprises a diluent.

5. A process for etching an organic anti-reflective coating on a base of a substrate, the process comprising steps of:

placing the substrate on a pedestal in a processing chamber;

introducing into the processing chamber an oxygen gas-free processing gas comprising one or more of carbon monoxide, carbon dioxide, and sulfur oxide; and forming an oxygen gas-free plasma from the processing gas to etch the organic anti-reflective coating layer;

wherein the processing gas further comprises $BCl_3$.

6. The process of claim 1 wherein the step of forming a plasma comprises forming an inductively coupled plasma.

7. The process of claim 6 wherein the process zone is maintained at a pressure from about 2 mT to about 20 mT.

8. The process of claim 6 wherein the step of forming an inductively coupled plasma includes applying an RF current to an inductive coil at a power level in a range from about 400 W to about 1000 W.

9. The process of claim 8 which further comprises applying an RF bias current to the pedestal at a power level in a range from about 30 W to about 100 W.

10. The process of claim 9 which further comprises heating the pedestal to a temperature in a range from about 30° C. to about 50° C.

11. A process for etching an organic anti-reflective coating on a base of a substrate, the process comprising steps of:

placing the substrate on a pedestal in a processing chamber;

introducing into the processing chamber an oxygen gas-free processing gas comprising carbon monoxide one or more of and carbon dioxide, and sulfur oxide; and forming an oxygen gas-free plasma from the processing gas to etch the organic anti-reflective coating layer;

wherein the step of forming a plasma comprises forming an inductively coupled plasma;

wherein the step of forming an inductively coupled plasma includes applying an RF current to an inductive coil at a power level in a range from about 400 W to about 1000 W;

which further comprises applying an RF bias current to the pedestal at a power level in a range from about 30 W to about 100 W; and which further comprises heating the pedestal to a temperature in a range from about 30° C. to about 50° C.; and wherein a flow rate of carbon monoxide for a chamber volume of around 19 to 20 liters is in a range from about 5 sccm to about 30 sccm.

12. The process of claim 11 wherein the process gas further comprises chlorine at a flow rate in a range from about 50 sccm to about 100 sccm.

13. The process of claim 12 which is carried out in a chamber having a volume larger than around 19 to 20 liters, wherein the flow rates, the power level of the RF current applied to the inductive coil, and the power level of the RF bias current applied to the pedestal are scaled to account for the larger volume.

14. A process for etching an organic anti-reflective coating that is deposited on a TiN antireflective coating, which, in turn, is deposited on an aluminum or aluminum alloy layer on a base of a substrate, the process comprising steps of:

placing the substrate on a pedestal in a processing chamber;

introducing into the processing chamber a processing gas which includes an etchant precursor consisting of one of: (a) carbon monoxide, (b) carbon monoxide and carbon dioxide, (c) carbon monoxide, carbon dioxide, and sulfur oxide, (d) carbon monoxide and sulfur oxide, (e) carbon dioxide, and (f) carbon dioxide and sulfur oxide; and forming an oxygen gas-free plasma from the processing gas to etch the organic anti-reflective coating layer.

\* \* \* \* \*